United States Patent
Kang

(10) Patent No.: US 11,860,237 B2
(45) Date of Patent: Jan. 2, 2024

(54) SYSTEM AND METHOD FOR BATTERY LIFE DIAGNOSIS

(71) Applicants: HYUNDAI MOTOR COMPANY, Seoul (KR); KIA CORPORATION, Seoul (KR)

(72) Inventor: Chun Yong Kang, Yongin-si (KR)

(73) Assignees: HYUNDAI MOTOR COMPANY, Seoul (KR); KIA CORPORATION, Seoul (KR)

(*) Notice: Subject to any disclaimer, the term of this patent is extended or adjusted under 35 U.S.C. 154(b) by 0 days.

(21) Appl. No.: 17/718,597

(22) Filed: Apr. 12, 2022

(65) Prior Publication Data
US 2023/0009045 A1    Jan. 12, 2023

(30) Foreign Application Priority Data
Jul. 6, 2021 (KR) .................. 10-2021-0088695

(51) Int. Cl.
*G01R 31/392* (2019.01)
*G01R 31/374* (2019.01)
*B60L 58/16* (2019.01)
*G01R 31/367* (2019.01)
*B60L 58/12* (2019.01)
*G01R 31/3835* (2019.01)

(52) U.S. Cl.
CPC .......... *G01R 31/392* (2019.01); *B60L 58/12* (2019.02); *B60L 58/16* (2019.02); *G01R 31/367* (2019.01); *G01R 31/374* (2019.01); *G01R 31/3835* (2019.01)

(58) Field of Classification Search
None
See application file for complete search history.

(56) References Cited

U.S. PATENT DOCUMENTS

| | | | |
|---|---|---|---|
| 9,063,018 B1* | 6/2015 | Ghantous | G01K 13/00 |
| 2021/0173012 A1* | 6/2021 | Subbotin | G01R 31/382 |
| 2022/0146590 A1* | 5/2022 | Asai | G01R 31/396 |

FOREIGN PATENT DOCUMENTS

KR    10-1949449 B1    2/2019

OTHER PUBLICATIONS

Liang He, et al., "Battery State-of-Health Estimation for Mobile Devices" in Proceedings of the 2017 ACM/IEEE 8th International Conference on Cyber-Physical Systems (ICCPS), Pittsburgh, PA, USA, 2017, pp. 18-21.

* cited by examiner

*Primary Examiner* — Jas A Sanghera
(74) *Attorney, Agent, or Firm* — MCDONNELL BOEHNEN HULBERT & BERGOFF LLP

(57) ABSTRACT

The present disclosure discloses a system for vehicle battery life diagnosis, the system comprised of a measuring unit which is installed inside a vehicle and measures a state of charge change and a temperature of a vehicle battery, a calculating unit which calculates battery relaxation voltage when a battery power line is cut off, and a diagnosis unit which uses the state of charge change and temperature measured at the measuring unit and the battery relaxation voltage calculated at the calculating unit to diagnose battery life and status.

12 Claims, 4 Drawing Sheets

SYSTEM AND METHOD FOR BATTERY LIFE DIAGNOSIS

CROSS REFERENCE TO RELATED APPLICATION

The present application claims priority to Korean Patent Application No. 10-2021-0088695, filed Jul. 6, 2021, the entire contents of which is incorporated herein for all purposes by this reference.

BACKGROUND

Field

The present disclosure relates to a system and method for battery life diagnosis. More specifically, the present disclosure relates to a system and method for calculating a relaxation voltage of a vehicle to diagnose battery life and status and predict battery life.

Description of the Related Art

Various devices which are operated by consuming electrical power may be provided in a vehicle, and a battery is provided to store electrical power for supplying to various devices. Recently, electric vehicles which are driven using batteries are on the rise.

The battery of an electrical vehicle is an important component in an electric vehicle, and battery capacity or voltage determine range and maximum motor output. A battery for an electric vehicle, once mounted on the vehicle, is not separated from the vehicle insofar as it does not severely impact vehicle operation, making it impossible to check the status of its deterioration. Therefore, technology for diagnosing the life and status of an electric vehicle battery, which is directly included in the performance, reliability and safety of an electric vehicle, is important.

In the case of conventional methods for diagnosing battery life and status, most apply partial data from the lithium battery degradation model to perform estimates.

The above description of prior art is intended solely to further understanding as to the background of the present disclosure, and shall not be construed as acknowledging that the present disclosure corresponds to prior art known to persons having ordinary skill in the art.

SUMMARY

Accordingly, the purpose of the present disclosure is to provide a system for diagnosing and predicting the life and status of a vehicle battery through changes in battery charge level, temperature data and battery relaxation voltage.

To solve the above-stated technical problem, the present disclosure provides a system for vehicle battery life diagnosis, the system comprised of a measuring unit which is installed inside a vehicle and measures a state of charge change and a temperature of a vehicle battery, a calculating unit which calculates battery relaxation voltage when a battery power line is cut off, and, a diagnosis unit which uses the state of charge change and temperature measured at the measuring unit and the battery relaxation voltage calculated at the calculating unit to diagnose battery life and status.

In one embodiment of the present disclosure, change in state of charge of the vehicle battery can be measured between a time point when battery use begins and a time point when battery use ends.

In one embodiment of the present disclosure, the time point when battery use begins and the time point when battery use ends can be measured based on time points when a transmission lever of a vehicle is shifted.

In one embodiment of the present disclosure, the calculating unit may measure an initial voltage of a battery output terminal when a battery power line is cut off and measure an increased at the battery output terminal after a certain time delay, then calculate a battery relaxation voltage from the difference between the initial voltage and the increased voltage.

In one embodiment of the present disclosure, the diagnosing unit may diagnose a battery life or status using the position of the currently measured battery relaxation voltage between a minimum value corresponding to a relaxation voltage of the battery in an initial state, and a maximum value corresponding to a relaxation voltage of the battery at the end of its life.

In one embodiment of the present disclosure, the diagnosing unit may be equipped with a battery SOH (State Of Health) map whose inputs are changes in battery state of charge, temperature data and relaxation voltage, and whose output is battery life and status, and may diagnose battery life and status using this battery SOH (State Of Health) map.

In one embodiment of the present disclosure, the diagnosing unit may, in a case where the battery relaxation voltage calculated at the calculating unit is greater than the relaxation voltage of a battery at the end of its life, diagnose the battery as failed.

As another means for solving the above-stated technical problem, the present disclosure provides a method for vehicle battery life diagnosis, the method comprised of measuring change in state of charge and temperature of a vehicle battery in a measuring unit, cutting off a battery power line and calculating a battery relaxation voltage in a calculating unit, and, using the change in state of charge and temperature of a vehicle battery and the calculated battery relaxation voltage to diagnose battery life and status in a diagnosing unit.

In one embodiment of the present disclosure, change in state of charge of the vehicle battery can be measured between a time point when battery use begins and a time point when battery use ends.

In one embodiment of the present disclosure, the time point when battery use begins and the time point when battery use ends can be measured based on time points when a transmission lever of a vehicle is shifted.

In one embodiment of the present disclosure, the calculating unit may measure an initial voltage of a battery output terminal when a battery power line is cut off and measure an increased at the battery output terminal after a certain time delay, then calculate a battery relaxation voltage from the difference between the initial voltage and the increased voltage.

In one embodiment of the present disclosure, the diagnosing unit may diagnose a battery life or status using the position of the currently measured battery relaxation voltage between a minimum value corresponding to a relaxation voltage of the battery in an initial state, and a maximum value corresponding to a relaxation voltage of the battery at the end of its life.

In one embodiment of the present disclosure, the diagnosing unit may be equipped with a battery SOH (State Of Health) map whose inputs are changes in battery state of charge, temperature data and relaxation voltage, and whose output is battery life and status, and may diagnose battery life and status using this battery SOH (State Of Health) map.

In one embodiment of the present disclosure, the diagnosing unit may, in a case where the battery relaxation voltage calculated at the calculating unit is greater than the relaxation voltage of a battery at the end of its life, diagnose the battery as faulty.

According to the system and method for diagnosing battery life described in the above, by diagnosing battery life and status using changes in battery state of charge, temperature data and relaxation voltage, relatively accurate battery life can be measured without using separate complicated sensors, etc.

Further, the system and method for diagnosing battery life described in the above can predict battery life through a SOH (State Of Health) map whose inputs are changes in battery state of charge, temperature data and relaxation voltage, and whose output is battery life and status.

Further, by diagnosing a battery status as faulty in a case where a calculated battery relaxation voltage is greater than the relaxation voltage of a battery that has reached the end of its life, it is possible to prevent accidents, and it is possible to convey accurate information to customers and manufacturers on battery after-service timing and the potential for occurrence of serious safety issues.

The benefits which can be yielded from the present disclosure are not limited to the benefits mentioned in the above, and other benefits mentioned shall be clearly understood by persons having ordinary skill in the art from the following.

DETAILED DESCRIPTION

Specific structural or functional description with regard to embodiments of the present disclosure disclosed in the present specification or application are exemplified solely for describing embodiments of the present disclosure, and the embodiments of the present disclosure may be carried out in various forms and shall not be interpreted as being limited to the embodiments described in the present specification or application. In the following, embodiments of the present disclosure shall be described in detail with reference to the attached drawings.

Figure 1:
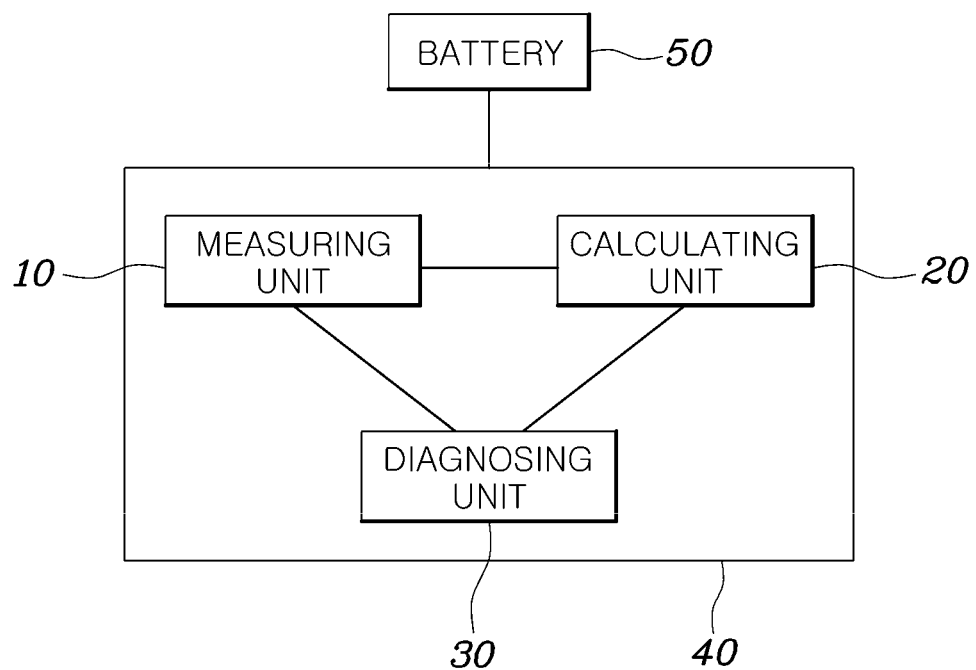
FIG. 1 is a simplified drawing of the system for diagnosing battery life according to one embodiment of the present disclosure.
Figure 2:
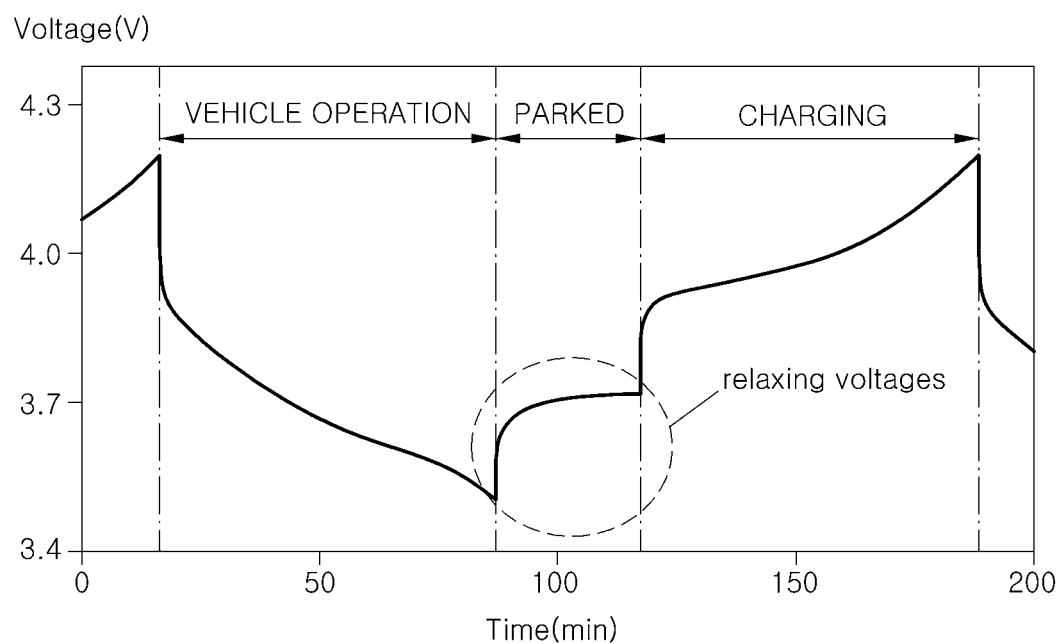
FIG. 2 is a graph illustrating relaxation voltage in the method for diagnosing battery life according to one embodiment of the present disclosure.
Figure 3:
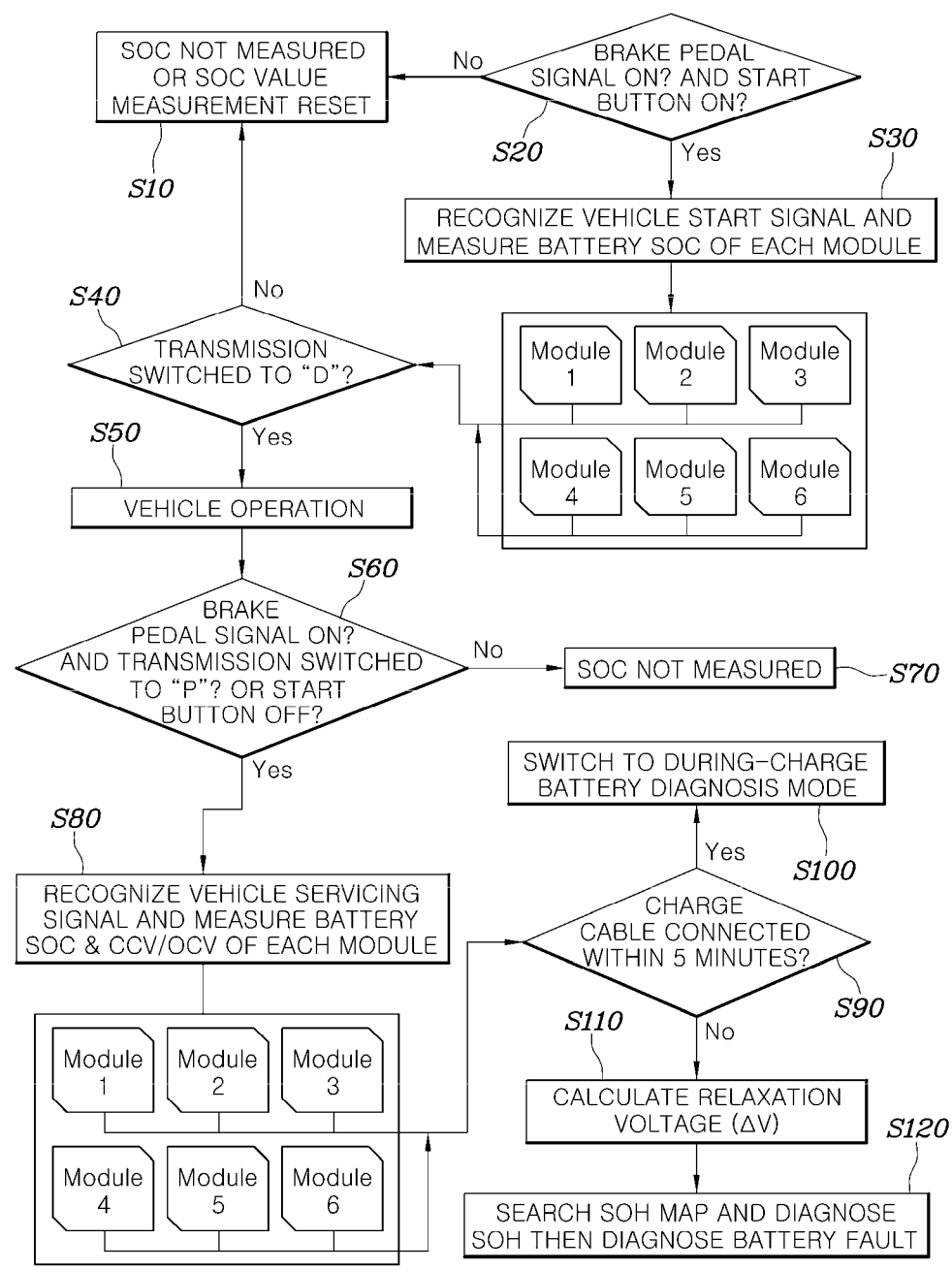
FIG. 3 is a flow chart illustrating the system for diagnosing battery life according to one embodiment of the present disclosure.
Figure 4:
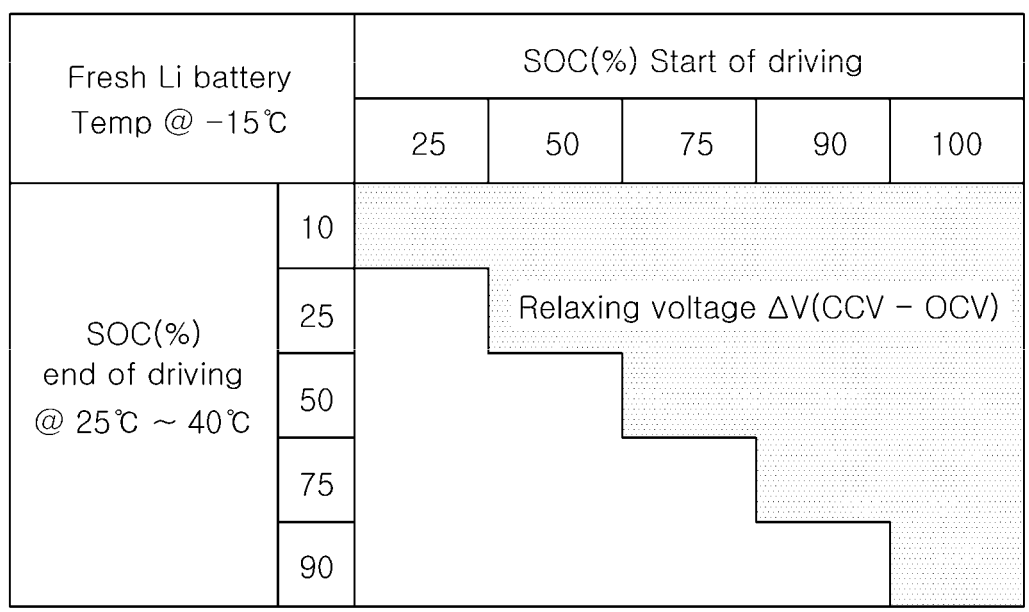
FIG. 4 is a table showing the SOH (State Of Health) map for a system for diagnosing battery life, whose inputs are changes in battery state of charge, temperature data and relaxation voltage, and whose output is battery life and status.

FIG. 1 is a simplified drawing of the system for diagnosing battery life according to one embodiment of the present disclosure, FIG. 2 is a graph illustrating relaxation voltage in the method for diagnosing battery life according to one embodiment of the present disclosure, FIG. 3 is a flow chart illustrating the system for diagnosing battery life according to one embodiment of the present disclosure, and FIG. 4 is a table showing the SOH (State Of Health) map for a system for diagnosing battery life, whose inputs are changes in battery state of charge, temperature data and relaxation voltage, and whose output is battery life and status.

FIG. 1 is a simplified drawing of the system for diagnosing battery life according to one embodiment of the present disclosure. Referring to FIG. 1, a system for vehicle battery life diagnosis 40, the system comprised of a measuring unit 10 which is installed inside a vehicle and measures a state of charge change and a temperature of a vehicle battery, a calculating unit 20 which calculates battery relaxation voltage when a battery power line is cut off, and a diagnosis unit 30 which uses the state of charge change and temperature measured at the measuring unit 10 and the battery relaxation voltage calculated at the calculating unit 20 to diagnose the life and status of the battery 50 is provided.

A battery is one of the core components which determine the speed and range of an electric vehicle and provides electrical power, which is important in an electric vehicle, and secondary batteries such as lithium ion batteries are generally used as such batteries. The present disclosure is wherein it is intended to diagnose the service timing of high-voltage, high-capacity vehicle batteries beforehand and prevent the occurrence of serious safety issues. To this end, vehicle battery life diagnosis and life prediction must be performed accurately.

A conventional battery mounted on the vehicle is not separated from the vehicle until the vehicle is scrapped, insofar as it does not severely impact vehicle operation, making it impossible to check the status of its deterioration. Therefore, technology for diagnosing the life and status of an electric vehicle battery, which is directly included in the performance, reliability and safety of an electric vehicle, is important. Conventional methods for diagnosing battery life and status, apply partial data from a battery management system based on the lithium battery degradation model to perform estimates. However, battery life diagnosis using partial battery management system data based on a battery degradation model has a problem of low accuracy.

Therefore, in the present disclosure, to diagnose and predict vehicle battery life, change in vehicle battery state of charge and temperature data measured in a measuring unit 10 and battery relaxation voltage calculated in a calculating unit 20 are used to diagnose battery life and status in a diagnosing unit 30.

Specifically, the battery measuring unit 10 is connected to a battery 50 of a vehicle, and may be provided at various points inside the vehicle. The calculating unit 20 of the present disclosure calculates a relaxation voltage when the supply of electrical power to a power line through which electrical power of the battery is supplied is cut off Because high current flows from a high voltage battery, the electrical connection is cut off when not being used. Relaxation voltage refers to the change in residual voltage at either terminal of a battery when electric connection to the battery has been cut off.

In the case of the present disclosure, in order to measure such relaxation voltage, the initial voltage at the battery output terminal when the battery power line is cut off may be measured, and after a certain time the increased voltage at the battery output terminal may be measured, and the relaxation voltage may be calculated from the difference between the initial voltage and the increased voltage. Finally, using the battery relaxation voltage calculated here and the change in state of charge and temperature measured at the measuring unit 10, the diagnosing unit 30 diagnoses the life and status of the battery. Calculating relaxation voltage from the difference between initial voltage and increased voltage using the fact that internal resistance increases with battery degradation is able to improve accuracy of battery life diagnosis over that of conventional battery degradation model-based diagnosis using partial battery management system data.

The life of the battery is diagnosed only after change in level or charge and battery temperature data is measured at the measuring unit 10, and calculation of battery relaxation voltage has been completed. That is, battery life diagnosis and life prediction occur only after measurement at the measuring unit 10 and measurement of relaxation voltage at the measuring unit 20 have occurred. Note that the charge state of the battery, state of charge, may be abbreviated as SOC, and the life of the battery, state of health, may be abbreviated as SOH.

The purpose of accurate battery SOH diagnosis is to accurately diagnose when the battery requires servicing, and to inform customers and manufacturers beforehand of any serious safety issues so that customer inconvenience and accidents can be prevented.

The measuring unit 10 may measure a change in a battery's state of charge between a battery use start time point and a battery use end time point.

The measuring unit 10 measures change in the state of charge of the battery, and the change in state of charge of the battery is measured between a battery use start time point and a battery use end time point. The current state of charge of the vehicle battery is measured, where the state of charge at full charge is 100% and 0% when the battery is completely discharged. Use of the vehicle battery begins at the time point when vehicle operation begins to obtain driving power, and use of the vehicle battery ends at the time point when operation of the vehicle is completed and the vehicle comes to a stop. Therefore, by using the measured state of charge at the battery use start time point and the battery use end time point, and the SOH map to be described later, it is possible to predict the life (state of health) of a vehicle battery and diagnose the life and status of the battery.

The battery use start time point and the battery use end time point may be measured based on time points when the vehicle transmission lever is shifted.

In a case where change in state of charge of a vehicle battery is measured based on a battery use start time point and a battery use end time point, the battery use start time point and battery use end time point can be determined based on whether or not the transmission lever of the vehicle has been shifted. This is because the time points at which the transmission lever of the vehicle is shifted normally coincide with the battery use start and end time points. Therefore, when the transmission lever of the vehicle is placed at "D", this is recognized as a driving mode and the time point when battery use begins, and the state of charge (SOC) of the battery is measured here. When the transmission lever of the vehicle is placed at "P", this is recognized as the time point when battery use ends, and the state of charge (SOC) of the battery is measured here. Using the measured values and an SOH map, the state of health of the vehicle battery may be predicted and the life and status of the battery may be diagnosed.

FIG. 2 is a graph illustrating relaxation voltage in the method for diagnosing battery life according to one embodiment of the present disclosure.

The calculating unit 20 may calculate a battery relaxation voltage using the difference between an initial voltage at the battery output terminal when the battery power line is cut off, and an increased voltage at the battery output terminal after a certain time delay.

Referring to FIG. 2, with respect to battery relaxation voltage, when the power line of the vehicle battery is cut off, battery voltage rises automatically and converges upon a certain value. Here, the change in voltage from the time point the power line of the vehicle battery is cut off through the BMS (battery management system) of the vehicle to the time point when battery voltage has risen is referred to as the relaxation voltage. The time point when vehicle operation begins can be seen as the battery use start time point, and the voltage measured during vehicle operation with the battery cathode and anode under load is called the closed circuit voltage, while the voltage measured when the vehicle is not in operation and the battery cathode and anode are not under load is called the open circuit voltage. Because the time point when the power line of the vehicle battery is cut off is the time point when the vehicle comes to a stop after operation, movement from the closed circuit voltage (CCV) to the open circuit voltage (OCV) at the time point the vehicle comes to a stop is monitored. Accordingly, the difference between the last open circuit voltage (OCV) at the battery use end time point and the closed circuit voltage (CCV) at the time point the vehicle comes to a stop is the battery relaxation voltage. Ultimately, as the closed circuit voltage (CCV) at the time point the vehicle comes to a stop is the initial voltage at the battery output terminal when the battery power line is cut off, and the final open circuit voltage (OCV) at the battery use end time point is the increased voltage at the battery output terminal after a certain time, the difference between the initial voltage and the increased voltage can be used to calculate the relaxation voltage of the battery.

The diagnosing unit 30 is able to diagnose the current life and status of the battery using the position of the currently measured battery relaxation voltage between a minimum value which corresponds to the relaxation voltage of the battery in an initial state and a maximum value which corresponds to the relaxation voltage of the battery at the end of its life.

As the lithium ion battery of a vehicle cannot be detached from the vehicle, the battery remains attached to the vehicle during use. Here, as internal resistance of the battery gradually increases with battery use, the voltage variability in the relaxation voltage of the battery increases as the remaining life of the battery decreases. As the relaxation voltage of the battery to be diagnosed lies between the relaxation voltage of an initial state battery and the relaxation voltage of a battery at the end of its life, the ratio between the remaining life had by an initial state battery and the remaining life of a battery at the end of its life can be used to diagnose the life and status of the battery to be diagnosed. By determining that the remaining life of the battery to be diagnosed is shorter the closer its relaxation voltage is to the relaxation voltage of a battery at the end of its life, and that the remaining life of the battery to be diagnosed is longer the closer its relaxation voltage is to the relaxation voltage of an initial state battery, the life and status of the battery to be diagnosed can be diagnosed.

FIG. 4 is a table showing the SOH (State Of Health) map for a system for diagnosing battery life, whose inputs are changes in battery state of charge, temperature data and relaxation voltage, and whose output is battery life and status.

The diagnosing unit 30 may be equipped with a battery SOH (State Of Health) map whose inputs are changes in battery state of charge, temperature data and relaxation voltage, and whose output is battery life and status, and may diagnose battery life and status using this battery SOH (State Of Health) map.

Referring to FIG. 4, a battery SOH map includes a multiplicity of tables such as that of FIG. 4 in which the battery relaxation voltage of an initial state battery and experimentally determined battery relaxation voltages at different degrees of battery degradation. As a battery degrades, internal resistance of the battery increases, and using this characteristic, if charging or discharging is interrupted for a certain time during constant current charging or discharging, the battery voltage drops or rises toward the OCV. The relaxation voltage is defined as the size of this change in voltage. To find out the life and status of a battery to be diagnosed, the change in vehicle battery state of charge as measured by the measuring unit 10 at the battery use start time point and the battery use end time point and the initial battery temperature are found on the SOH map. The reason for measuring change in battery charge and temperature in the present disclosure is to perform battery life diagnosis and prediction under identical conditions by measuring the temperature of the vehicle battery prior to operation, and to ascertain the state of charge of a vehicle battery before use and when use has ended to calculate its relaxation voltage, thereby accurately diagnose and measure the remaining life of the battery.

Then, the relaxation voltage of the battery to be diagnosed is found by finding the difference between the initial voltage at the output terminal of the battery when the battery power line is cut off, and the increased voltage at the output terminal of the battery after a certain time, and then finding the corresponding battery relaxation voltage in the battery SOH map. Here, using the corresponding relaxation voltage found in the battery SOH map, the corresponding degree of battery degradation in the top left corner of the table can be found. Using this degree of battery degradation, the life and status of the battery to be diagnosed can be determined.

The diagnosing unit 30 may, in a case where the relaxation voltage of the battery as calculated by the calculating unit 20 is greater than the relaxation voltage at the end of its life, diagnose the status of the battery as faulty.

As for the method for diagnosing the status of a battery as faulty, the internal resistance of the battery gradually increases as the battery is used, and therefore the size of the change in voltage in the relaxation voltage grows gradually as battery life decreases. The relaxation voltage of the battery to be diagnosed is located between the relaxation voltage of an initial state battery and the relaxation voltage of a battery at the end of its life, and in a case where the battery relaxation voltage calculated for the battery to be diagnosed is greater than the relaxation voltage of a battery at the end of its life, it may be determined that the degradation of the battery to be diagnosed is greater than that of a battery at the end of its life, and the status of the battery to be diagnosed may be diagnosed as faulty.

FIG. 3 is a flow chart illustrating the system for diagnosing battery life according to one embodiment of the present disclosure.

Referring to FIG. 3, the method for diagnosing battery life of a vehicle battery according to one embodiment of the present disclosure is comprised of measuring change in state of charge and temperature of a vehicle battery in a measuring unit 10 at S30 and S80, cutting off a battery power line and calculating a battery relaxation voltage in a calculating unit 20 at S110, and using the change in state of charge and temperature of a vehicle battery and the calculated battery relaxation voltage to diagnose battery life and status in a diagnosing unit 30 at S120.

Prior to measuring change in state of charge and temperature of a vehicle battery in a measuring unit 10 at S30, the method may further comprise determining whether or not a driver's brake pedal signal is turned on or an ignition signal is turned on at S20.

In a case where a driver's brake pedal signal is turned off and the ignition signal is turned off in determining whether or not a driver's brake pedal signal is turned on or an ignition signal is turned on at S20, the method may further comprise not measuring change in state of charge and temperature of the vehicle battery or resetting a measured value at S10.

Measuring change in state of charge and temperature of a vehicle battery (S30, S80) may include measuring change in vehicle battery state of charge between a battery use start time point and a battery use end time point.

The battery use start time point and battery use end time point may be measured based on a vehicle transmission lever shift time point at S40.

After measuring based on a vehicle transmission lever shift time point at S40, the method may further comprise vehicle operation at S50.

After vehicle operation at S50 and prior to measuring change in vehicle battery state of charge and temperature at S80, the method may further comprise determining whether or not a driver's brake pedal signal is turned on and the transmission is switched to parking mode, or whether or not an ignition button is turned off at S60.

In a case where, in determining whether or not a driver's brake pedal signal is turned on and the transmission is switched to parking mode, or whether or not an ignition button is turned off at S60, it is determined that the driver's brake pedal is turned off, that the transmission has not been switched to parking mode, or that the ignition button is turned on, the method may further comprise not measuring change in vehicle battery state of charge and temperature at S70.

After determining whether or not a driver's brake pedal signal is turned on and the transmission is switched to parking mode, or whether or not an ignition button is turned off at S60 and prior to calculating battery relaxation voltage at S110, the method may further include determining whether or not a charge cable has been connected to the vehicle within 5 minutes at S90.

In a case where, in determining whether or not a charge cable has been connected to the vehicle within 5 minutes at S90, a charge cable has been connected to the vehicle within 5 minutes, the method may further comprise transitioning to a vehicle battery charge diagnosis mode at S100.

Calculating battery relaxation voltage at S110 may include measuring an initial voltage at a battery output terminal when a battery power line is cut off, measuring increased voltage at the battery output terminal after a certain time, then calculating battery relaxation voltage using the difference between initial voltage and increased voltage.

Diagnosing battery life and status at S120 may include using a position of the relaxation voltage of the currently measured battery between a minimum value corresponding to a relaxation voltage of an initial state battery and a maximum value corresponding to a relaxation voltage of a battery at the end of its life to diagnose the life and status of the current battery.

Diagnosing battery life and status at S120 may further include diagnosing battery life and status using a battery SOH (state of health) map whose inputs are changes in battery state of charge, temperature data and relaxation voltage, and whose output is battery life and status.

Diagnosing battery life and status at S120 may further include, in a case where the battery relaxation voltage calculated at the calculating unit is greater than the relaxation voltage of a battery at the end of its life, diagnosing the battery as faulty.

Whereas specific embodiments of the present disclosure have been illustrated and described in the foregoing, it shall be self-evident to a person having ordinary skill in the art that the present disclosure may be modified and changed in various ways without departing from the technical idea of the present disclosure as provided in the appended claims.

What is claimed is:

1. A system for vehicle battery life diagnosis, the system comprising:
    a measuring unit installed inside a vehicle and configured to measure a state of charge change and a temperature of a vehicle battery;
    a calculating unit which calculates battery relaxation voltage when a battery power line is cut off; and
    a diagnosis unit which uses the state of charge change and temperature measured at the measuring unit and the battery relaxation voltage calculated at the calculating unit to diagnose battery life and status;
    wherein the calculating unit measures an initial voltage at a battery output terminal when a battery power line is cut off, and an increased voltage at the battery output terminal after a certain time delay, then calculates battery relaxation voltage from a difference between the initial voltage and the increased voltage.

2. The system for vehicle battery life diagnosis of claim 1, wherein a change in state of charge of the vehicle battery is measured based on a battery use start time point and a battery use end time point.

3. The system for vehicle battery life diagnosis of claim 2, wherein the battery use start time point and the battery use end time point are measured based on time points when a vehicle transmission lever is shifted.

4. The system for vehicle battery life diagnosis of claim 1, wherein the diagnosing unit diagnoses the current life and status of a currently measured battery using a position of a relaxation voltage of the currently measured battery between a minimum value which corresponds to a relaxation voltage of a battery in an initial state, and a maximum value which corresponds to a relaxation voltage of a battery at the end of a life of the battery.

5. The system for vehicle battery life diagnosis of claim 1, wherein the diagnosing unit is equipped with a battery SOH (State Of Health) map having inputs including changes in battery state of charge, temperature data and relaxation voltage, and having output including battery life and status, and diagnoses battery life and status using such battery SOH (State Of Health) map.

6. The system for vehicle battery life diagnosis of claim 1, wherein the diagnosing unit, in a case where a battery relaxation voltage calculated at the calculating unit is greater than a relaxation voltage of a battery at the end of its life, diagnoses a status of the battery as faulty.

7. A method for vehicle battery life diagnosis, the method comprising:
    measuring a change in state of charge and temperature of a vehicle battery by a measuring unit;
    cutting off a battery power line and calculating a battery relaxation voltage by a calculating unit; and
    using change in state of charge and temperature of a vehicle battery and a calculated battery relaxation voltage to diagnose battery life and status by a diagnosing unit;
    wherein calculating battery relaxation voltage comprises measuring an initial voltage at a battery output terminal when a battery power line is cut off, measuring increased voltage at a battery output terminal after a certain time, and then calculating battery relaxation voltage using a difference between an initial voltage and an increased voltage.

8. The method for vehicle battery life diagnosis of claim 7, wherein measuring change in state of charge and temperature of a vehicle battery comprises measuring change in vehicle battery state of charge between a battery use start time point and a battery use end time point.

9. The method for vehicle battery life diagnosis of claim 8, wherein a battery use start time point and battery use end time point are measured based on a vehicle transmission lever shift time point.

10. The method for vehicle battery life diagnosis of claim 7, wherein diagnosing battery life and status comprises using a position of the relaxation voltage of a currently measured battery between a minimum value corresponding to a relaxation voltage of an initial state battery, and a maximum value corresponding to a relaxation voltage of a battery at the end of a life of the battery to diagnose life and status of a current battery.

11. The method for vehicle battery life diagnosis of claim 7, wherein diagnosing battery life and status further comprises diagnosing battery life and status using a battery SOH (State Of Health) map having inputs including changes in battery state of charge, temperature data and relaxation voltage, and having outputs including battery life and status.

12. The method for vehicle battery life diagnosis of claim 7, wherein diagnosing battery life and status further comprises, in a case where a battery relaxation voltage calculated at a calculating unit is greater than a relaxation voltage of a battery at the end of a life of the battery, diagnosing the battery as faulty.

* * * * *